United States Patent [19]

Fernandez Duran et al.

[11] Patent Number: 5,530,406
[45] Date of Patent: Jun. 25, 1996

[54] FREQUENCY SYNTHESIZER HAVING A PHASE-LOCKED LOOP STRUCTURE FOR FAST GENERATION OF RADIO-FREQUENCY CHANNELS

[75] Inventors: Alfonso Fernandez Duran; Mariano Perez Abadia; Angel Gonzalez Ahijado, all of Madrid, Spain

[73] Assignee: Alcatel Standard Electrica S.A., Madrid, Spain

[21] Appl. No.: 155,954

[22] Filed: Jun. 7, 1995

[30] Foreign Application Priority Data

Nov. 30, 1992 [ES] Spain .................. 9202428

[51] Int. Cl.$^6$ .................. H03L 7/06; H03L 7/18
[52] U.S. Cl. .................. 331/12; 455/260; 327/105; 327/107
[58] Field of Search .................. 331/1 A, 12, 11; 329/300, 308, 304, 336, 363; 332/100, 103, 127, 128, 104; 370/105.3; 455/260, 183.1, 85, 86, 75, 76; 375/324, 295, 296, 298, 303; 327/105, 107

[56] References Cited

U.S. PATENT DOCUMENTS

| | | | |
|---|---|---|---|
| 3,568,067 | 3/1971 | Williford | 375/324 |
| 3,748,590 | 7/1973 | Gray | 331/12 |
| 3,768,030 | 10/1973 | Brown et al. | 329/325 X |
| 3,789,316 | 1/1974 | Goetz et al. | 331/12 |
| 4,100,503 | 7/1978 | Lindsey et al. | 331/1 A |
| 4,143,322 | 3/1979 | Shimamura | 325/320 |
| 4,314,206 | 2/1982 | Attwood et al. | 331/12 X |
| 4,358,740 | 11/1982 | Dinter | 331/1 A |
| 4,470,145 | 9/1984 | Williams | 329/308 X |
| 4,507,617 | 3/1985 | Sasaki | 331/12 X |
| 5,036,296 | 7/1991 | Yoshida | 332/103 |

FOREIGN PATENT DOCUMENTS

| | | |
|---|---|---|
| 1275491 | 10/1961 | France . |
| 0143906 | 9/1982 | Japan .................. 329/308 |

OTHER PUBLICATIONS

"Double Loop PLL Based Frequency Synthesizer With A Continuous Phase Divider" by Ori Kost, et al, The 15th Conference of Electrical & Electronics Engineers in Israel, Apr. 7–9, 1987, pp. 1–3.

Primary Examiner—Robert Pascal
Assistant Examiner—Arnold Kinkead
Attorney, Agent, or Firm—Ware, Fressola, Van Der Sluys & Adolphson

[57] ABSTRACT

Based on a phase lock loop structure, having a reference signal generator (1), a first phase detector (2), a low pass filter (3), a VCO (4) and a frequency divider (5), in order to achieve a faster channel switching an maintain the design of the filters to be as simple as possible, a second phase detector (6) is provided that receives the reference signal (9) and a second output signal (11) coming from the frequency divider (5) and shifted 90° with respect to its other output signal (10), and that generates a second phase error signal (13), in quadrature with the first phase error signal (12), that is filtered by a second low pass filter (7) thereby generating a second filtered phase error signal (15). The two filtered phase error signals (14,15) are provided to a quadratic correlator (8) whose output is provided to the VCO (4). Its amplitude is proportional to the difference of frequencies between the reference signal (9) and any of the output signals (10,11) from the frequency divider (5).

3 Claims, 2 Drawing Sheets

FREQUENCY SYNTHESIZER HAVING A PHASE-LOCKED LOOP STRUCTURE FOR FAST GENERATION OF RADIO-FREQUENCY CHANNELS

TECHNICAL FIELD

The present invention relates to communications and, more particularly, to a frequency synthesizer.

BACKGROUND TO THE INVENTION

There are many digital communication systems that make use of Multi-Frequency Time Division Multiple Access techniques (MF-TDMA). These systems use frequency syntesizers for generating the channel frequencies that will be used to transmit the digital information.

As the present systems work at high rates, it becomes necessary to reduce the guard time between consecutive time slots in order to keep a high efficiency of the system, which means that in case of a change in the radio-frequency channel, the frequency synthesizer must switch its old frequency to the new one quickly, as it is necessary to make sure that the new frequency is already established when the next time slot of the MF-TDMA system starts.

There are many techniques for minimizing the switching time between channels.

Some of them are based on the use of a loop filter whose bandwidth varies, being larger at the beginning when the loop is totally unlocked, and getting narrower when the loop is getting locked, as indicated in the article "Phase loop design for TDMA Applications" by C. Ryan, published into the 1985 IEEE Military Communications Conference MIL-COM'85, Vol. 2, pp. 320 to 323.

The main drawback of this type of techniques is that when it is necessary to reduce the switching time between channels, it is also necessary to increase the complexity of the loop filter which results in the synthesizer becoming more expensive and less reliable, increasing the possibility that the frequency synthesizer stability may be negatively affected.

DISCLOSURE OF INVENTION

An object of the present invention is to reduce the switching time between channels, without increasing the complexity of the filter or filters of the frequency synthesizer and without affecting the stability of the frequency synthesizer.

According to the present invention, a synthesizer based on a phase-locked loop structure, of the type comprising a reference signal generator that generates a reference signal that is connected to a first phase detector that generates a first phase error signal, that in turn is connected to a first low-pass filter that generates a first filtered phase error signal, and that is connected to a voltage-controlled oscillator whose output is frequency-divided n times lower than the frequency of the signal at the output of the voltage-controlled oscillator, and wherein the divided output signal is connected to the phase detector and wherein the frequency divider provides a second output signal shifted 90° with respect to its other output signal, which is provided to a second phase detector that also receives as an input the reference signal, and that provides a second phase error signal which is in quadrature with the first phase error signal generated by the first phase detector; a second low-pass filter is connected to the second phase detector and provides a second filtered phase error signal; a quadratic correlator receives, as inputs, both of the filtered phase error signals and provides a third output signal to the VCO whose amplitude is proportional to the difference of frequencies between the reference signal and any of the output signals from the frequency divider.

The quadratic correlator can be either of the balanced type or of the unbalanced type.

With the application of this type of structure, important advantages are obtained, like a fast response to the channel switching, maintaining a high spectral purity of the synthesized signal, and using a low complexity structure. This allows it to be used in communication systems where a dynamic channel allocation is employed as, for instance, DECT (Digital European Cordless Telecommunication) system.

Other important advantages are the simplicity of the new elements that comprise this structure that do not increase its cost appreciably and also that the working frequency range depends very little on the switching time and spectral purity of the output signal. Altogether it allows high performances in a frequency range wider than that of the conventional synthesizers.

These and other objects, features and advantages of the present invention will become more apparent in light of the detailed description of a best mode embodiment thereof, as illustrated in the accompanying drawings.

BEST MODE FOR CARRYING OUT THE INVENTION

Figure 1:
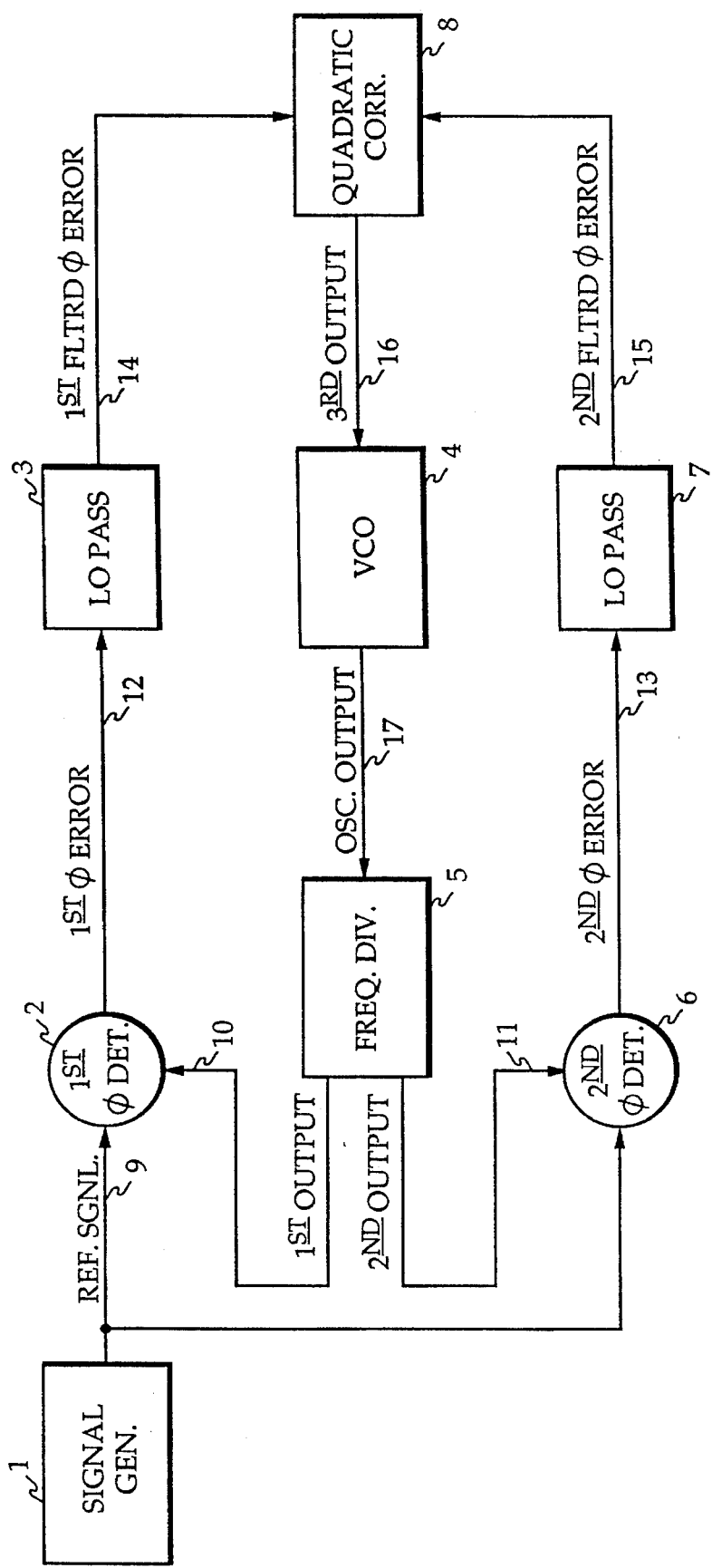
FIG. 1 shows a general block diagram of the synthesizer according to the invention.

The block diagram of FIG. 1 represents a Phase Lock Loop as disclosed in the present invention. It comprises a reference signal generator 1 that generates an instantly changing frequency reference signal 9, with stability as required by the system. This reference signal 9 provides to a first phase detector 2 and to a second phase detector 6, to be compared with respective phases of output signals 10 and 11 coming from a frequency divider 5 and whose most representative characteristic is that both signals 10 and 11 are in quadrature, which means that their relative phase is shifted by 90°.

Phase error signals 12 and 13 coming respectively from phase detectors 2 and 6 provides, also respectively, to the low pass filters 3 and 7, characterised by their high simplicity and whose task is to eliminate the frequency sum at the output of the phase comparators 2 and 6.

From the above mentioned low pass filters 3 and 7 it is attained first and second filtered phase error signals 14 and 15, which are shifted ninety degrees with respect to each other and which are provided to a quadratic correlator 8; this last generating a control voltage 16 whose amplitude is proportional to the difference of frequencies between the reference signal 9 and any of the output signals 10, 11 from the frequency divider 5.

This control voltage 16 is applied to a VCO 4 (Voltage Controlled Oscillator), the frequency of its output signal 17 being the synthesized frequency, and that depends for its frequency proportionally on the voltage applied to its input.

The output signal 17 from the VCO 4 is applied to the frequency divider 5, this last attaining two output signals 10 and 11 whose frequency is the frequency of the output signal 17 from the VCO 4, divided by a N-factor and shifted in phase ninety degrees from each other as previously indicated.

Figure 2:
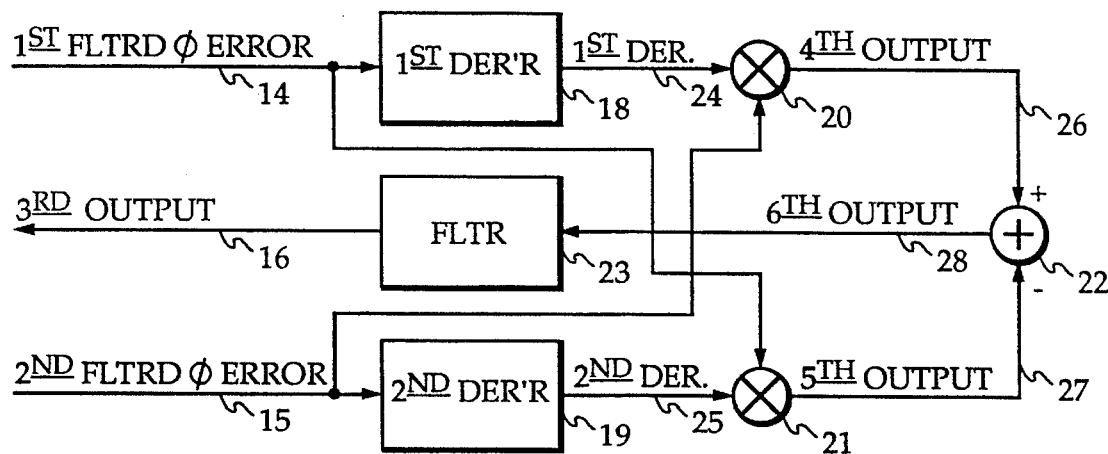
FIG. 2 shows a more detailed block diagram of block 8 in case that a balanced quadratic correlator is used.

FIG. 2 shows a possible implementation of the quadratic correlator 8, which constitutes a balanced quadratic correlator.

It comprises two derivative circuits 18 and 19 which are respectively supplied by the filtered phase error signals 14 and 15, generating respectively the derivative signals 24 and 25. There is also a first multiplier 20 that multiplies the second filtered phase error signal 15 by the derivative signal 24 of the filtered phase error signal 14, and a second multiplier 21 that multiplies the first filtered phase error signal 14 by the derivative signal 25 of the second filtered phase error signal 15.

The respective output signals 26 and 27 from both multipliers 20 and 21 are subtracted, the second from the first, in a subtractor 22, that attains an output signal 28 whose amplitude has the form K ($f_1$-$f_2$), K being a proportionality constant and $f_1$ and $f_2$ respectively the frequencies of the reference signal 9 and of any of the output signals 10, 11 from the frequency divider 5.

This output signal 28 coming from the subtractor 22 is applied to a first integrator filter 23 that attains the control voltage 16 to be applied to the VCO 4.

Figure 3:
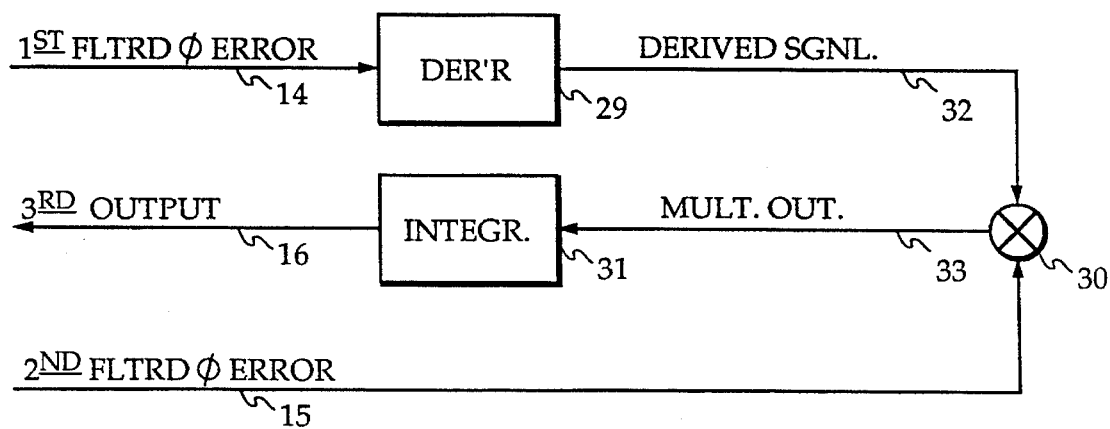
FIG. 3 shows a more detailed block diagram of block 8 in case that an unbalanced quadratic correlator is used.

FIG. 3 shows another possible implementation of the quadratic correlator 8, which constitutes an unbalanced quadratic correlator which has great simplicity.

It comprises a third derivative circuit 29 that attains a derivative signal 32 of the first filtered phase error signal 14.

This derivative signal 32, coming from the third derivative circuit 29, is provided to a third multiplier 30 that also receives the second filtered phase error signal 15 and that generates an output signal 33 whose amplitude has the form K ($f_1$-$f_2$) [1+cos 2($\omega_1$−$\omega_2$)t] that is proportional, as in the first case, to the frequency difference between the reference signal 9 and any of the output signals 10, 11 of the frequency divider 5, plus a ripple of frequency twice said frequency difference, and which is eliminated by an integrator filter 31 that receives the output signal 33 of the third multiplier 30 and that generates the voltage control 16 that will be provided to the VCO 4.

We claim:

1. A frequency synthesizer having a phase lock loop structure for synthesizing from a reference signal that changes frequency instantly, a channel frequency signal for use in transmitting digital information, comprising:

a first phase detector (2), responsive to said reference signal (9), for providing a first phase error signal (12), that in turn is provided to a first low pass filter (3) that provides a first filtered phase error signal (14);

a voltage-controlled oscillator (4), responsive to a third output signal (16), for providing an oscillator output signal (17) provided to a frequency divider (5) that provides a first output signal (10) whose frequency is N times lower than a frequency of the oscillator output signal (17), and that is provided to the first phase detector (2) and wherein the frequency divider (5) provides a second output signal (11) which is shifted ninety degrees with respect to the first output signal (10);

a second phase detector (6) that is responsive to the reference signal (9) and to the second output signal (11), for providing a second phase error signal (13) which is in quadrature with the first phase error signal (12);

a second low pass filter (7) responsive to the second phase error signal for providing a second filtered phase error signal (15); and a quadratic correlator (8) responsive to both the first and second filtered phase error signals (14, 15) for providing the third output signal (16) to the voltage-controlled oscillator (4), the third output signal having an amplitude instantly proportional to a frequency difference between the reference signal (9) and either of the first and second output signals (10, 11).

2. A frequency synthesizer according to claim 1, wherein the quadratic correlator (8) comprises:

a first derivator (18) responsive to the first filtered phase error signal (14), for providing a first derived signal (24);

a second derivator (19) responsive to the second filtered phase error signal (15), for providing a second derived signal (25);

a first multiplier (20), responsive to the first derived signal (24) and to the second filtered phase error signal (15), for providing a fourth output signal (26);

a second multiplier (21), responsive to the second derived signal (25) and to the first filtered phase error signal (14), for providing a fifth output signal (27);

a first subtractor (22), responsive to the fourth and fifth output signals (26, 27), for providing a sixth output signal (28) having an amplitude proportional to a difference of frequencies between the reference signal (9) and any of the first and second output signals (10, 11); and a first integrator filter (23), responsive to the sixth output signal (28), for providing the third output signal (16).

3. A frequency synthesizer according to claim 1, wherein the quadratic correlator (8) comprises:

a derivator (29), responsive to the first filtered phase error signal (14), for providing a derived signal (32);

a multiplier (30), responsive to the derived signal (32) and the second filtered phase error signal (15), for providing a multiplier output signal (33) having an amplitude proportional to a frequency difference between the reference signal (9) and any of the first and second output signals (10, 11) from the frequency divider (5) plus a ripple of frequency twice said frequency difference; and an integrator filter (31), responsive to the multiplier output signal (33), for providing the third output signal (16).

* * * * *

UNITED STATES PATENT AND TRADEMARK OFFICE
CERTIFICATE OF CORRECTION

PATENT NO. : 5,530,406
DATED : June 25, 1996
INVENTOR(S) : Fernandez Duran et al It is certified that error appears in the above-indentified patent and that said Letters Patent is hereby corrected as shown below:

On title page, item [22], please delete the incorrect filing date "June 7, 1995" and insert the correct filing date --November 19, 1993--.

Signed and Sealed this

Seventeenth Day of September, 1996

*Attest:*

BRUCE LEHMAN

*Attesting Officer*     *Commissioner of Patents and Trademarks*